(12) United States Patent
Behrends et al.

(10) Patent No.: US 8,395,963 B2
(45) Date of Patent: *Mar. 12, 2013

(54) DATA SECURITY FOR DYNAMIC RANDOM ACCESS MEMORY AT POWER-UP

(75) Inventors: Derick G. Behrends, Rochester, MN (US); Todd A. Christensen, Rochester, MN (US); Travis R. Hebig, Rochester, MN (US); Daniel M. Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 165 days.

This patent is subject to a terminal disclaimer.

(21) Appl. No.: 12/963,965

(22) Filed: Dec. 9, 2010

(65) Prior Publication Data

US 2012/0147661 A1 Jun. 14, 2012

(51) Int. Cl.
*G11C 8/00* (2006.01)
(52) U.S. Cl. .................... 365/230.06; 365/149
(58) Field of Classification Search ............. 365/230.06, 365/149, 233.13
See application file for complete search history.

(56) References Cited

U.S. PATENT DOCUMENTS

| | | | | |
|---|---|---|---|---|
| 6,282,135 | B1 * | 8/2001 | Proebsting | 365/203 |
| 6,515,891 | B2 * | 2/2003 | Kronke et al. | 365/145 |
| 7,106,616 | B2 * | 9/2006 | Takahashi | 365/145 |
| 2012/0087176 | A1 * | 4/2012 | Behrends et al. | 365/149 |

* cited by examiner

*Primary Examiner* — Vu Le
(74) *Attorney, Agent, or Firm* — Martin and Associates LLC; Bret J. Petersen

(57) ABSTRACT

A circuit and method erase at power-up all data stored in a DRAM chip for increased data security. All the DRAM memory cells are erased by turning on the transistors for the DRAM storage cells simultaneously by driving the wordlines of all the cells to an activated state. With all the devices turned on, the data stored in the memory cells is erased as the voltage of all the cells connected to a common bitline coalesce to a single value. In a preferred embodiment, the wordlines are all turned on simultaneously during a power on reset period. Preferably a power on reset signal is used to drive each logic gate of the pre-decoder portion of the address decoder in order to assert all the wordlines.

11 Claims, 5 Drawing Sheets

DATA SECURITY FOR DYNAMIC RANDOM ACCESS MEMORY AT POWER-UP

BACKGROUND

1. Technical Field

This disclosure generally relates to data security and dynamic random access memory (DRAM), and more specifically relates to providing data security for data stored in a DRAM by driving to an active state all the wordlines to clear any persistent data on power up of the DRAM chip.

2. Background Art

It has been shown that traditional DRAM chips such as those used for memory in computer laptops and other electronic devices have security issues. While it is commonly thought that the data on a DRAM chip is no longer available after powering down the chip, actually the data on the chip is persistent such that the data may still be available after power is turned off. The data, stored as a charge on a capacitor, is still available because the charge on the individual DRAM capacitors leaks off very slowly. In addition, the leak off time can be dramatically increased by chilling the DRAM device. An intruder could possibly obtain access to secure information in the DRAM.

Computer laptops or other portable computer devices are particularly vulnerable to theft of data in DRAM memory. An intruder with physical access to a laptop could potentially read all the data stored in memory even if the laptop has been powered down or placed in a password protected state such as a hibernate mode. In one scenario, this form of data theft is accomplished by powering down a laptop, and then booting it from an external drive, which runs a program that copies the entire contents of the DRAM onto this external drive. The copied data from the memory can then be mined for important data such as security keys or encryption keys. The security keys could then be used to gain access to sensitive/classified/restricted data on the hard drive that would not be available without the security keys.

BRIEF SUMMARY

The disclosure is directed to a circuit and method for erasing at power-up all data stored in a DRAM chip for increased data security. All the DRAM memory cells are erased by turning on the transistors for the DRAM storage cells simultaneously by driving to an active state the wordlines of all the cells. With all the devices turned on, the data stored in the memory cells is erased as the voltage of all the cells connected to a common bitline coalesce to a single value. In a preferred embodiment, the wordlines are all turned on simultaneously during a power on reset period. Preferably a power on reset signal is used to drive each logic gate of the pre-decoder portion of the address decoder in order to assert all the wordlines.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

Described herein is a circuit and method for erasing at power-up all data stored in a DRAM chip for increased data security. All the DRAM memory cells are erased by turning on the transistors for the DRAM storage cells simultaneously by driving to an active state the wordlines of all the cells. With all the devices turned on, the data stored in the memory cells is erased as the voltage of all the cells connected to a common bitline coalesce to a single value. In a preferred embodiment, the wordlines are all turned on simultaneously during a power on reset period. Preferably a power on reset signal is used to drive each logic gate of the pre-coder portion of the address decoder in order to assert all the wordlines.

Figure 1:
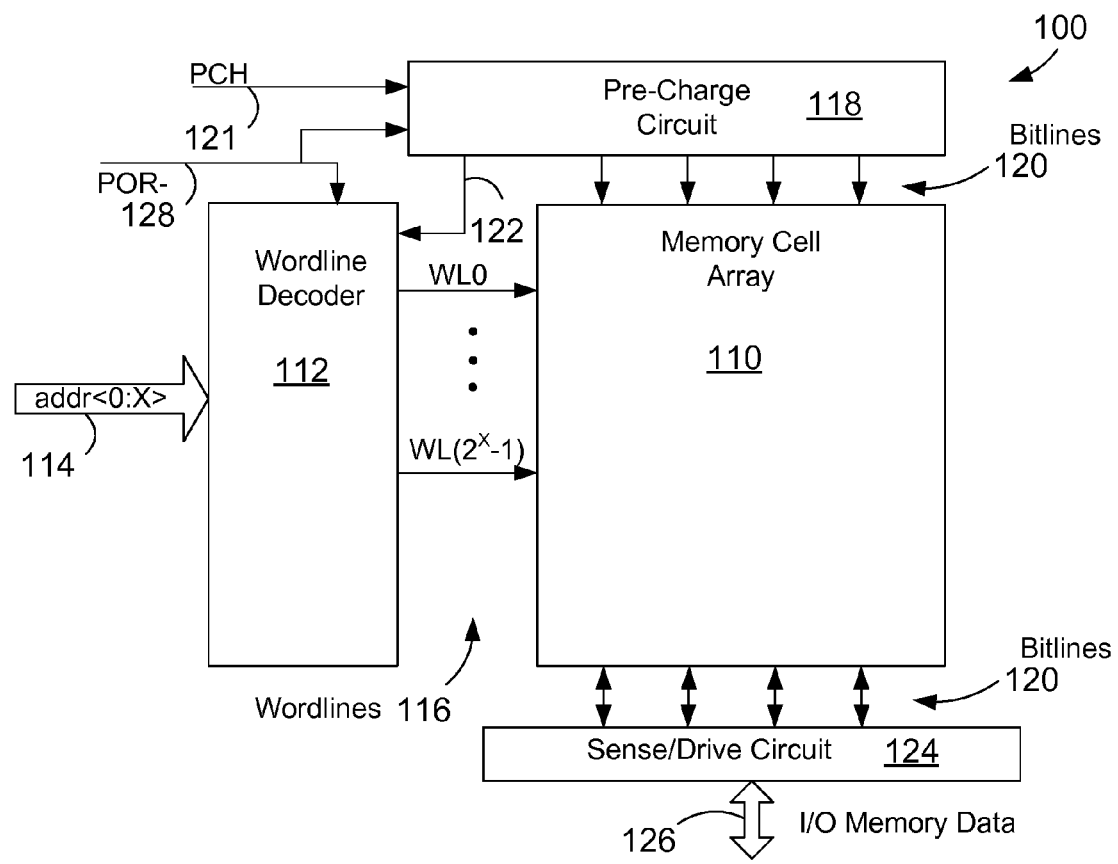
FIG. 1 is a portion of a DRAM memory circuit for erasing the memory cells at power up for increased security of DRAM memory.
Figure 4:
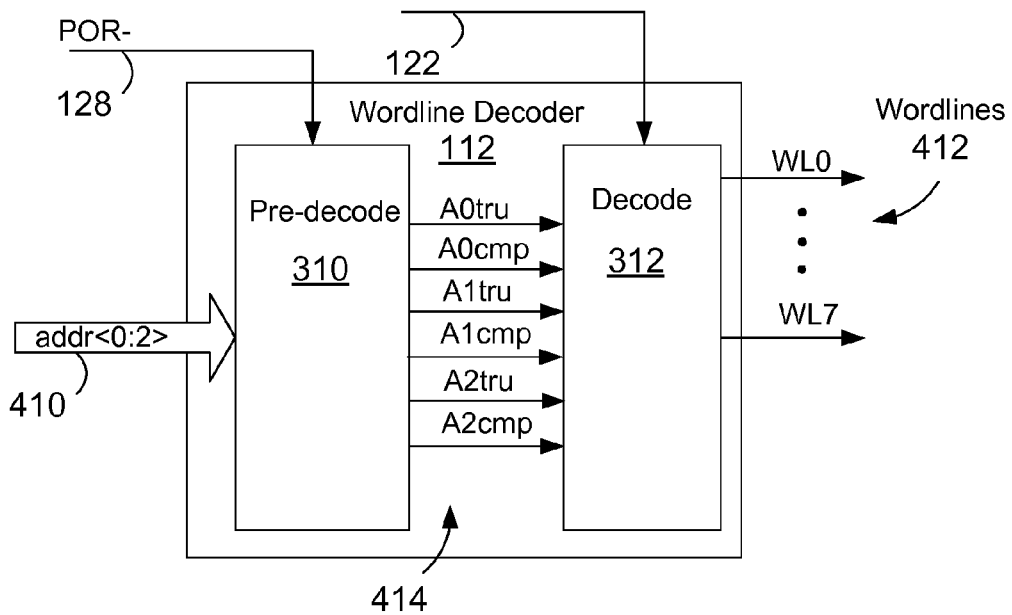
FIG. 4 is a block diagram of the wordline decoder shown in FIG. 3 with three address lines according to an example described herein.

FIG. 1 is a block diagram with an example memory circuit 100 which is capable of erasing data stored in a memory cell array 110 at power up for increased security. The memory cell array 110 is typically made of many memory cells with a cell for each bit of the memory as described below with reference to FIG. 2. The memory circuit 100 includes a wordline decoder 112 that receives as input an address 114 and outputs wordlines 116 for each wordline into the memory cell array 110. In the illustrated example, the address lines are represented by the term "addr<0:X>", where the "X" is an integer variable. This means that there is an address bus with address lines "addr0" through address line "addrX". With address lines addr0 through addrX into the wordline decoder 112, the wordline decoder 112 produces $2^X$ wordlines 116. These wordlines 116 are represented as WL0 through WL($2^X$−1). As an example, if the variable "X" was the integer 2, then there would be three address lines (addr0, addr1 and addr2). The three address lines into the wordline decoder 112 would correspond to eight wordlines at the output (WL0 through WL7). This example is illustrated in FIG. 4 and described below.

Again referring to FIG. 1, the memory circuit 100 further includes a pre-charge circuit 118 for pre-charging the bit lines 120. The pre-charge circuit drives the bit lines to a known level prior to the interrogation portion of the memory cycle as is commonly done in the prior art. The pre-charge circuit 118 is controlled by a pre-charge signal (PCH) 121. The pre-charge circuit 118 also outputs a pre-charge off (pcoff) signal 122. The pre-charge off signal 122 is used to prevent any of the wordlines 116 from being on during the pre-charge portion of a memory cycle as done in the prior art. The pre-charge off signal 122 is high during access to a memory as described below. The memory circuit 100 further includes a sense/drive circuit 124 that inputs and outputs memory data 126 to and from the memory array 110. During a read of the memory array 110, the sense/drive circuit 124 senses a charge on the bit lines 120 to output data 126 stored on the memory cells and during a write operation the sense/charge circuit drives the bits lines 120 to write data to the memory cells in the memory array 110. The memory circuit 100 further includes a power-on reset (POR–) signal 128 connected to the wordline decoder 112 and to the pre-charge circuit 118 to erase data in the memory cell array 110 as described further below. With the exception of the POR– signal 128 and how it interacts with the circuits as described below, in other respects not described herein the memory circuit 100 shown in FIG. 1 may operate in the same manner as a common prior art DRAM memory circuit.

Figure 2:
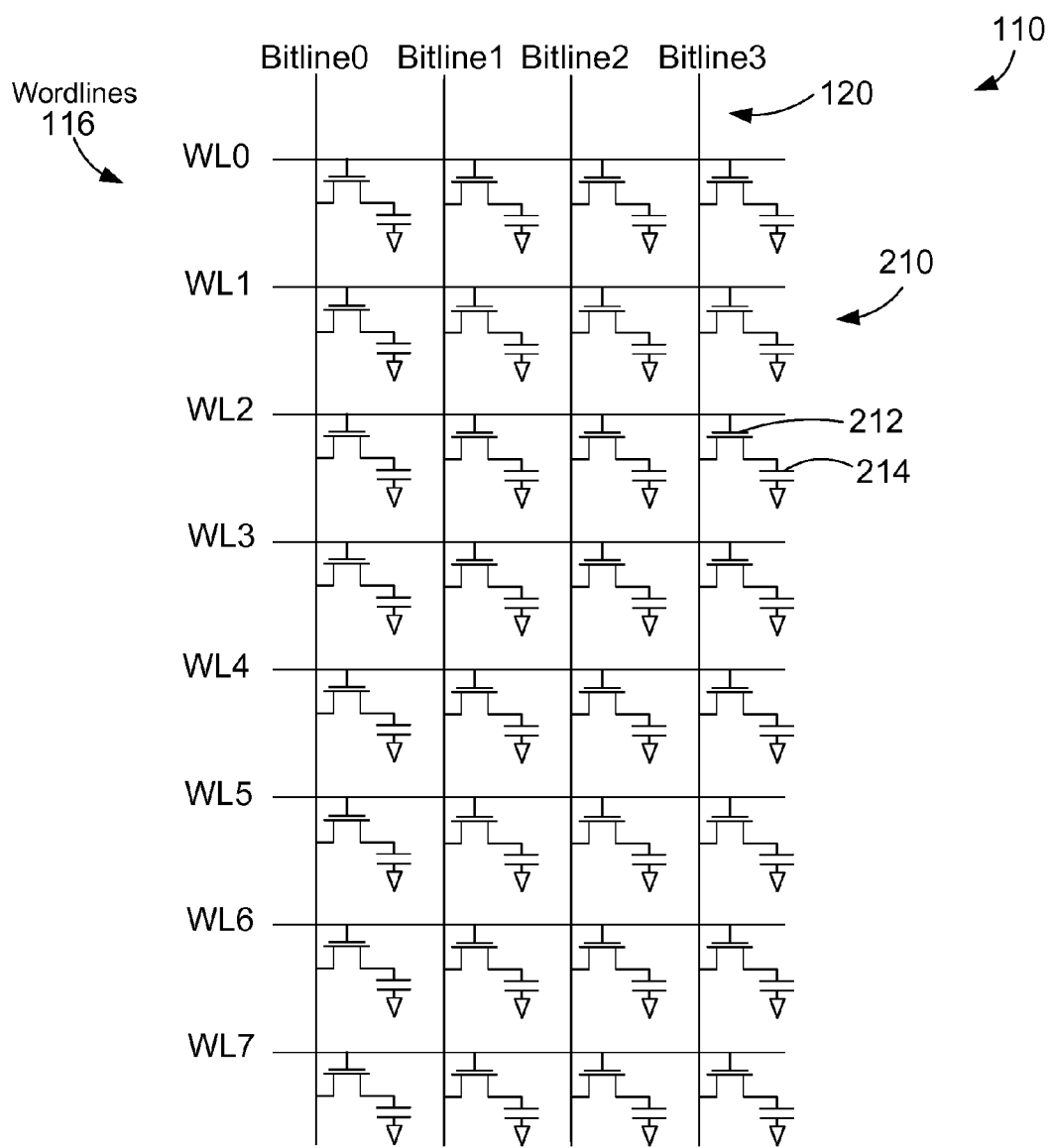
FIG. 2 is a block diagram of a memory cell array 110 as introduced in FIG. 1.

FIG. 2 is a schematic diagram that represents the memory cell array 110 shown in FIG. 1 and described above. The memory cell array 110 is preferably a DRAM memory with an array of memory cells 210. The memory cells 210 in the array are connected by a number of bitlines 120 and wordlines 116. In the abbreviated example shown in FIG. 2, there are four bitlines 116 (Bitline0 through Bitline3) and eight wordlines 116 (WL0-WL7). The DRAM memory cells 210 used as an example herein are N-type Field Effect Transistors (NFETs) paired with a capacitor in a complementary metal-oxide semiconductor (CMOS) device as know in the prior art. In the illustrated example, the DRAM memory cells 210 include an NFET transistor 212 for storing a charge on a capacitor 214. The level stored on the capacitor 214 depends on the logic level supplied by a Bitline 120 when activated by a Wordline 116. The circuit 100 clears or erases the data stored in the DRAM memory cells 210 at power up by first turning off the precharge and then turning on all the memory cell NFETs 212 at the same time.

Again referring to FIGS. 1 and 2, the memory circuit 100 includes a power on reset signal that initiates erasing the memory cells 110. In this example, the power on reset is a negative asserted signal (POR–) 128 to match the logic of the other circuits. The POR– signal 128 is preferably generated on the DRAM chip to increase security. Methods and circuits for generating a POR– signal in response to energization of an integrated circuit by a power supply are known in the prior art. In the example circuit 100 shown in FIG. 1, the POR– signal 128 drops to a low logic level at power-up of the integrated circuit containing the circuit 100. The POR– signal 128 is used to drive all the wordlines to their activated state for a time period sufficient to erase the memory cells as described below. The POR– signal 128 is connected to the wordline decoder 112 and to the pre-charge circuit 118. The circuit to provide the POR– signal 128 may be constructed in any suitable manner, including those known in the prior art or developed in the future.

Figure 3:
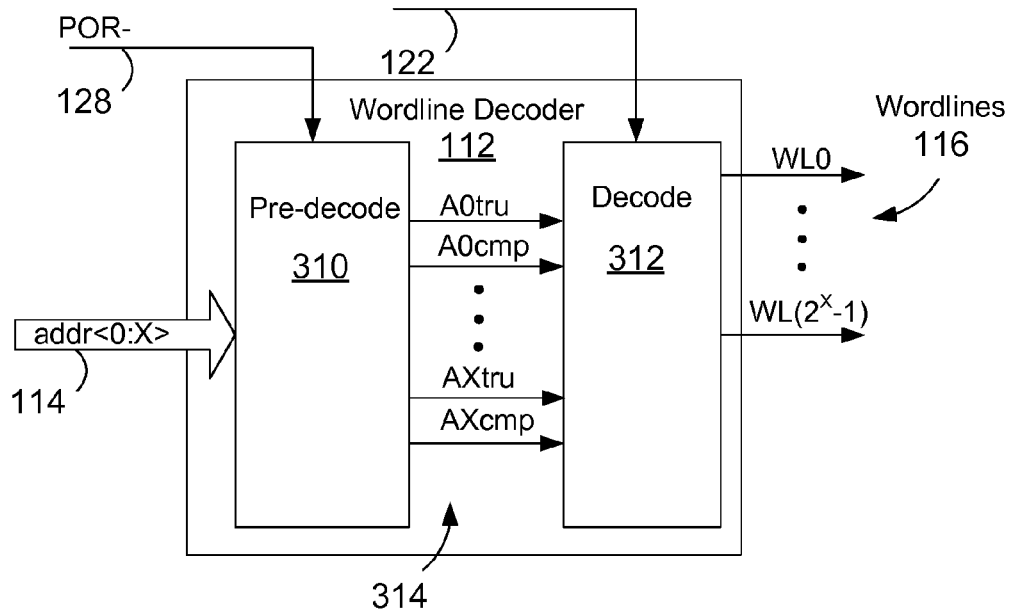
FIG. 3 is a block diagram of a wordline decoder of a DRAM memory with a power on reset signal connected to the pre-decoder of the wordline decoder which activates all the wordlines to erase the data stored in the memory cells at power up.

FIG. 3 illustrates a block diagram with further details of the wordline decoder 112 introduced with reference to FIG. 1. The wordline decoder 112 includes a pre-decode stage 310 and a decode stage 312. The wordline decoder 112 inputs the POR–signal 128 described above to activates all the wordlines to erase the data stored in the memory cells at power up as described herein. In normal operation, the pre-decode stage 310 inputs address lines 114 and outputs two signals for each address bit. In the illustrated example, the pre-decode stage 310 inputs address bits addr<0,X> as described above to represent a variable number of address bits. The pre-decode stage 310 outputs a pair of signals 314 for each input bit. One of the pair is asserted high when the bit is high and the other of the pair is asserted high when the complement of that bit is high. Thus, there is a "true" and "complement" signal for each address bit. These bits are represented in FIG. 3 as A0*tru* (Bit A0 true) and A0*cmp* (bit A0 complement) for bit A0, and similarly AX*tru* and AX*cmp* for each additional bit. In normal operation, only one output of each pair of outputs "true" and "complement" would be driven at any one time. In the illustrated example, the POR– signal 128 is connected to the pre-decode stage 310 to override the normal operation and assert both signals of each pair such that all the outputs 314 of the pre-decode stage 310 are asserted when the POR signal is asserted. With all the outputs 314 of the pre-decode stage 310 asserted the decode circuit 312 then asserts all the wordlines to all turn on all the memory cell transistors 212 (FIG. 2) to erase the memory contents.

FIG. 4 illustrates a block diagram to illustrate a specific example of the wordline decoder 112 described with reference to FIG. 3. The wordline decoder 112 inputs the POR reset signal 128 described above to activates all the wordlines to erase the data stored in the memory cells at power up. In this example, the wordline decoder 112 has three input address bits 410 designated as addr<0:2>. Thus, in this example, the "X" in the general case shown in FIG. 1 is the integer "3". Therefore there are $2^3$ or 8 wordlines 412. The pre-decode stage 310 produces a true and complement pair for each address bit. In the illustrated example of FIG. 4, the pre-decode stage 310 inputs three address bits, addr0, addr1 and addr2 410. The pre-decode stage 310 outputs six signals 414 (A0*tru*, A0*cmp*, A1*tru*, A1*cmp* and A2*tru*, A2*cmp*), with a pair of signals for each input bit. There is a "true" and "complement" signal for each address bit. This results in A0*tru* (Bit A0 true) and A0*cmp* (bit A0 complement) for bit A0, and similarly A1*tru*, A1*cmp*, A2*tru* and A2*cmp* for bits A1 and A2. As described above, in normal operation only one of each pair is normally asserted. However, when the POR– signal is asserted, all of the pre-decode stage 310 outputs 414 are asserted such that the decode circuit 312 will drive all the wordlines 412 at the same time.

Figure 5:
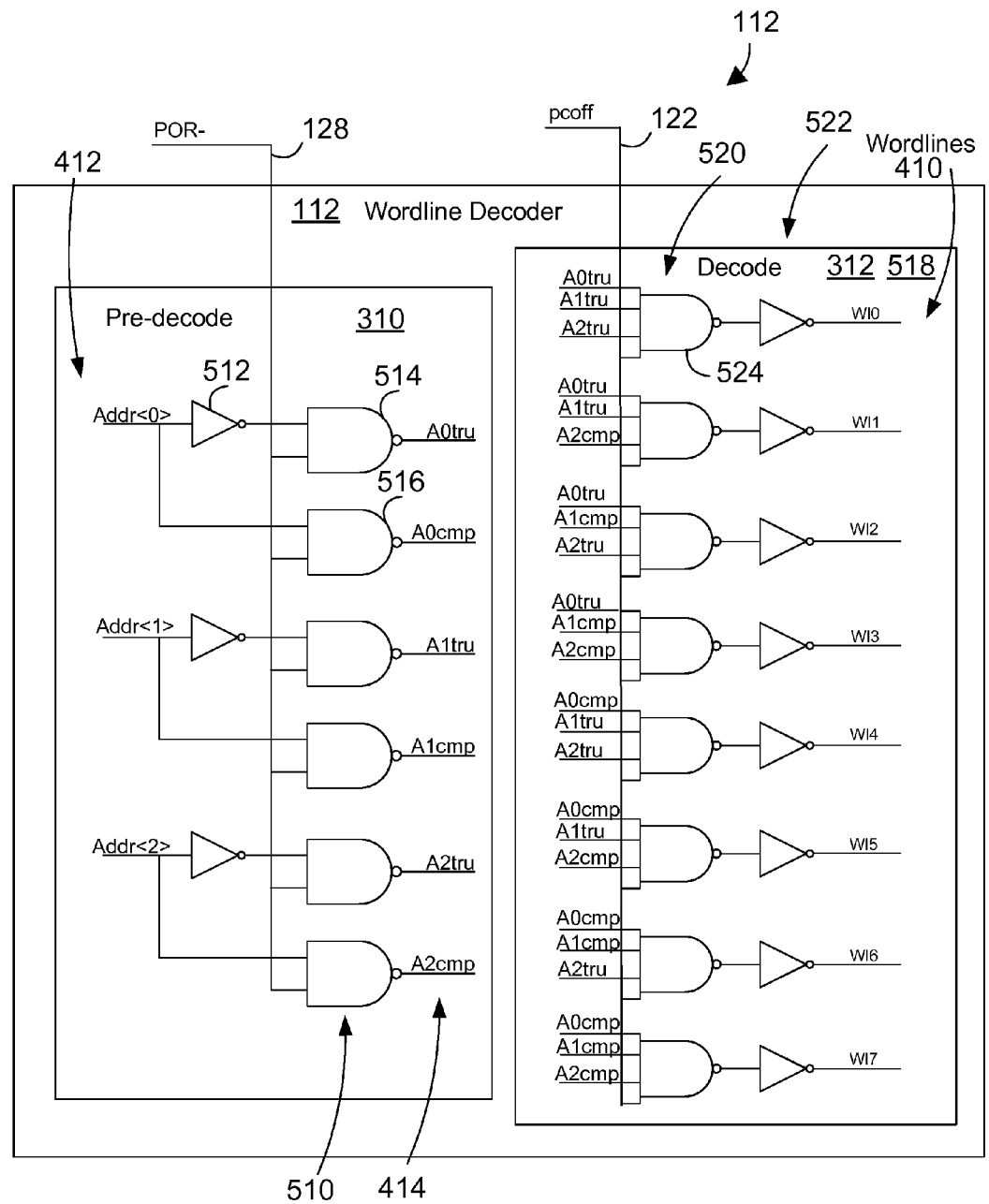
FIG. 5 is a schematic diagram that represents one example of implementing a wordline decoder 112 as described in FIG. 3.

FIG. 5 illustrates a schematic diagram that represents one example of implementing the wordline decoder 112 in FIG. 3. As described above, the wordline decoder 112 includes a pre-decode stage 310 and a decode circuit 312. Again, in this example there are 3 address bits addr0, addr1, and addr2 410. The address bits 410 are input into the pre-decode stage 310 of the wordline decoder 112 that has two logic Nand gates 510 for each address bit. As is understood by those in the art, other logic gates could be used such as And gates, Nor gates, etc. Address bit Addr<0> is connected to the input of an inverter 512. The output of the inverter 512 is connected to a first Nand gate 514. The address bit Addr<0> is also connected to an input of a second Nand gate 516. A second input of each of the first and second Nand gates 514, 516 is connected to the POR– signal 128. The output of the first Nand gate 514 is A0*tru*, and the output of the second Nand gate 516 is A0*cmp*. The Addr<1> and Addr<2> address bits are connected in the same manner to the Nand gates 516 as shown to produce corresponding "true" and "complement" versions of the address bits 412. When the POR– signal 118 is high, the pre-decode stage 310 operates to assert one of each pair of the pre-decode outputs 414, where either the "true" or "complement" for each address bit is asserted. The pre-decode outputs 414 are then input to the decode circuit 312 to drive the wordlines 412. In contrast, when the POR– signal is asserted low to the Nand gates 516, all the pre-decode outputs 414 are asserted. This causes the decode circuit 312 to drive all the words lines 412 as described below.

As described above, the pre-decode outputs 414 shown in FIG. 5 are inputs to the decode circuit 312. The decode circuit 312 normally drives one of wordlines 412 depending on pre-decode outputs which are determined by the particular address on the address bits 412. The decode circuit 312 in this example comprises a single decode stage 518 with a bank of Nand gates 520 having a four input Nand gate for each of the wordlines 410. Each of the Nand gates 520 are connected to an inverter 522 to drive a wordline 410. Three of the inputs of each Nand gate 520 are pre-decode outputs 414 such that one Nand gate will be turned on for each possible value of the address bits 412. For example, the first Nand gate 524 has inputs A0*tru*, A1*tru* and A2*tru*. Thus the wordline "Wl0" will be asserted when the address on the address bits 412 (Addr<0:2>) is "111". In a similar manner, each of the Nand gates 520 will drive a single wordline 410. The "pcoff" signal 122 is applied to a fourth input of each of the Nand gates 520. The pcoff signal 122 insures that the wordlines 410 are not asserted during the pre-charge phase of the memory access cycle as has been done in the prior art. In this example, the wordline decode circuit 312 has a single stage of decode provided by the four input Nand gates 516. For a larger memory as would be typical in the art, the Nand gates would need to be much larger with many inputs. Thus in the art, the decode circuit 312 is often broken down into multiple stages. For example, the 3 bit decoder described here could be broken down into 2 stages with the first stage having 3 input Nand gates (to include the pcoff signal) and the second stage having a two input Nand gates. Similarly, a larger memory with 32 bits could be broken down into four or eight stages. The pre-decode circuit described here and the concepts of this example expressly extend to other decode circuits regardless of the number of stages.

Figure 6:
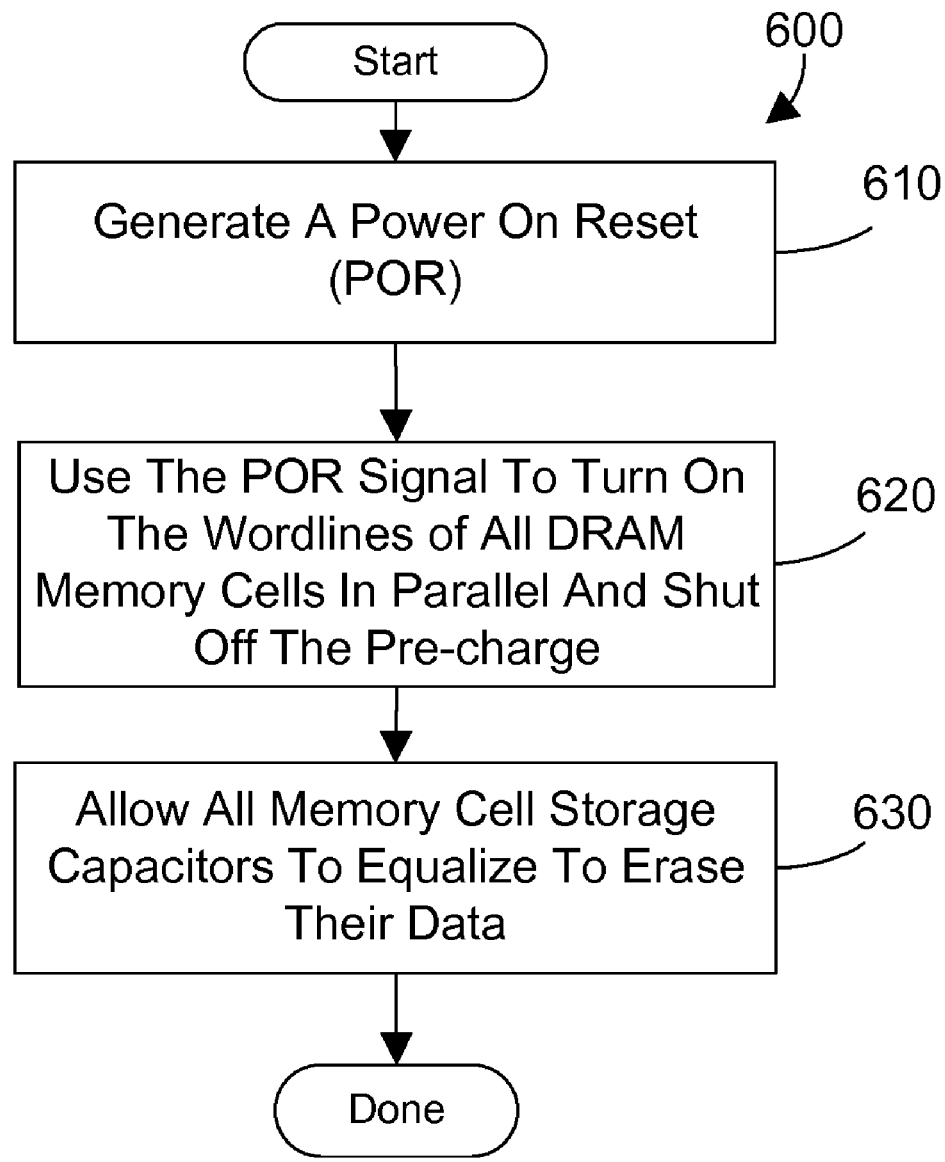
FIG. 6 is a method flow diagram for clearing a DRAM memory at power up.

FIG. 6 shows a method 600 for clearing a DRAM memory at power up as claimed herein. First, generate a POR signal (step 610). Next, use the POR signal to drive the wordlines of all the memory cells in the memory cell array (step 620). Then allow the memory storage cell capacitors to equalize and clear or erase the data stored on the memory cells (step 630). The method is then done.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An electronic circuit comprising:
    a plurality of memory cells each having a capacitor for storing data and a transistor connected to a bitline and a wordline;
    a power on reset (POR) signal connected to a wordline decoder that causes the wordline decoder to drive all the wordlines to an active state that are connected to the transistors in the plurality of memory cells to turn on the transistors and coalesce a voltage stored on the capacitors of all memory cells connected to a common bit line; and
    wherein the wordline decoder comprises a pre-decode stage that receives as input a number of address bits and outputs a true and complement signal for each address bit, wherein the pre-decode stage includes a logic gate to assert both the true and complement signal in response to the POR signal.

2. The electronic circuit of claim 1 wherein the POR signal is generated on an integrated circuit containing the electronic circuit.

3. The electronic circuit of claim 1 wherein each of the plurality of memory cells is a DRAM memory cell with a N-type Field Effect Transistor (NFET).

4. The electronic circuit of claim 1 wherein the logic gate is a Nand gate.

5. The electronic circuit of claim 1 where in the wordline decoder further comprises:
    a decode circuit with at least one decode stage that inputs the true and complement signals for each address bit from the pre-decode stage to output the wordlines.

6. An electronic circuit comprising:
    a plurality of DRAM memory cells each having a capacitor for storing data and a transistor connected to one of a plurality of bit lines and a wordlines;
    a power on reset (POR) signal connected to a wordline decoder that causes the wordline decoder to drive all the wordlines to an active state that are connected to the transistors in the plurality of memory cells to turn on the transistors and coalesce a voltage stored on the capacitors of all memory cells connected to a common bit line;
    a pre-decode stage that inputs a number of address bits and outputs a true and complement signal for each address bit, wherein the pre-decode stage includes a logic gate to assert both the true and complement signal in response to the POR signal;
    a decode circuit with at least one decode stage that inputs the true and complement signals for each address bit from the pre-decode stage to output the wordlines; and
    wherein the POR signal is generated on an integrated circuit containing the electronic circuit.

7. A method for clearing a DRAM memory at power up, the method comprising the steps of:
    (A) generating a power on reset (POR) signal during a period after the power up of the DRAM memory;
    (B) applying the POR signal to a wordline decoder to drive all wordlines of the wordline decoder connected to an array of memory cells in the DRAM memory, wherein the wordline decoder comprises a pre-decode stage that inputs a number of address bits and outputs a true and complement signal for each address bit, wherein the pre-decode stage includes a logic gate to assert both the true and complement signal in response to the POR signal; and
    (C) allowing capacitors of the memory cells to equalize in voltage to clear the data contents of the DRAM memory.

8. The method of claim 7 further comprising the step of:
    generating the power on reset (POR) signal on a chip containing the DRAM memory.

9. The method of claim 7 wherein the wordline decoder further comprises a decode circuit with at least one decode stage that inputs the true and complement signals for each address bit from the pre-decode stage to output the wordlines.

10. The method of claim 7 wherein the DRAM memory comprises N-type Field Effect Transistor (NFET) transistors.

11. A method for clearing a DRAM memory at power up, the method comprising the steps of:
    (A) generating a power on reset (POR) signal on a chip containing the DRAM memory during a period after the power up of the DRAM memory comprising N-type Field Effect Transistor (NFET) transistors;
    (B) applying the POR signal to a wordline decoder to drive all wordlines of the wordline decoder connected to an array of memory cells in the DRAM memory, wherein the wordline decoder comprises a pre-decode stage that inputs a number of address bits and outputs a true and complement signal for each address bit, and a decode circuit with at least one decode stage that inputs the true and complement signals for each address bit from the pre-decode stage to output the wordlines, wherein the pre-decode stage includes a logic gate to assert both the true and complement signal in response to the POR signal; and
    (C) allowing capacitors of the memory cells to equalize in voltage to clear the data contents of the DRAM memory.

* * * * *